(12) United States Patent
Oh et al.

(10) Patent No.: US 11,199,577 B2
(45) Date of Patent: Dec. 14, 2021

(54) TEST SOCKET AND TEST APPARATUS HAVING THE SAME, MANUFACTURING METHOD FOR THE TEST SOCKET

(71) Applicant: TSE CO., LTD., Chungcheongnam-do (KR)

(72) Inventors: Chang Su Oh, Chungcheongnam-do (KR); Bo Hyun Kim, Chungcheongnam-do (KR)

(73) Assignee: TSE CO., LTD., Chungcheongnam-do (KR)

( * ) Notice: Subject to any disclaimer, the term of this patent is extended or adjusted under 35 U.S.C. 154(b) by 0 days.

(21) Appl. No.: 17/204,186

(22) Filed: Mar. 17, 2021

(65) Prior Publication Data
US 2021/0293880 A1  Sep. 23, 2021

(30) Foreign Application Priority Data

Mar. 19, 2020  (KR) ........................ 10-2020-0033952

(51) Int. Cl.
| G01R 1/04 | (2006.01) |
| G01R 1/067 | (2006.01) |
| G01R 35/00 | (2006.01) |
| G01R 31/28 | (2006.01) |
| G01R 15/12 | (2006.01) |

(52) U.S. Cl.
CPC ....... *G01R 31/2889* (2013.01); *G01R 1/0441* (2013.01); *G01R 31/2896* (2013.01)

(58) Field of Classification Search
CPC .......... G01R 1/04; G01R 1/067; G01R 35/00; G01R 31/02; G01R 31/28; G01R 31/2889; G01R 31/2896; G01R 31/302; G01R 15/12; H01R 12/00
See application file for complete search history.

(56) References Cited

U.S. PATENT DOCUMENTS

| 2007/0269999 A1* | 11/2007 | Di Stefano | ........ H01R 13/2471 439/73 |
| 2011/0187140 A1* | 8/2011 | Hashimoto | .............. B25J 15/00 294/103.1 |
| 2013/0027071 A1* | 1/2013 | Canegallo | .......... G01R 31/3025 324/754.21 |

FOREIGN PATENT DOCUMENTS

| KR | 10-2006-0062824 | 6/2006 |
| KR | 10-2011-0003732 | 1/2011 |

(Continued)

OTHER PUBLICATIONS

Notice of Allowance dated Jan. 20, 2021 corresponding to Korean Patent Application No. 10-2020-0033952.

*Primary Examiner* — Neel D Shah

(57) ABSTRACT

The present invention relates to a test socket configured to electrically connect a tester generating a test signal and a device under inspection to each other includes a nonelastic electrically-conductive housing having a plurality of housing holes passing therethrough in a thickness direction, an insulating coating layer applied on at least an upper surface of the nonelastic electrically-conductive housing and a circumference of each of the plurality of housing hole, and an electrically-conductive part formed to have a configuration in which a plurality of electrically-conductive particles are contained in an elastic insulating material, disposed in the housing hole such that a lower end portion thereof may be connected to a signal electrode of the tester placed below the nonelastic electrically-conductive housing.

22 Claims, 10 Drawing Sheets

(56) References Cited

FOREIGN PATENT DOCUMENTS

| KR | 10-2011-0015474 | 2/2011 |
| KR | 10-1471652 | 12/2014 |
| KR | 10-1598606 | 2/2016 |
| KR | 101598606 B1 * | 2/2016 |
| KR | 10-2017-0016688 | 2/2017 |

* cited by examiner

TEST SOCKET AND TEST APPARATUS HAVING THE SAME, MANUFACTURING METHOD FOR THE TEST SOCKET

CROSS-REFERENCE TO RELATED APPLICATION

This application claims priority of Korean Patent Application No. 10-2020-0033952, filed on Mar. 19, 2020, in the KIPO (Korean Intellectual Property Office), the disclosure of which is incorporated herein entirely by reference.

BACKGROUND OF THE INVENTION

Field of the Invention

The present disclosure relates to a test socket, and more particularly, to a test socket configured to electrically connect a device under inspection and a tester to each other, a test apparatus including the same, and a method for manufacturing the test socket.

Description of the Related Art

A semiconductor package is formed by integrating fine electronic circuits at a high density, and during the manufacturing process, a test process is performed to determine whether each electronic circuit is normal. The test process is a process of selecting good and defective products by testing whether the semiconductor package is operating normally.

A test apparatus, which electrically connects a terminal of the semiconductor package and a tester applying a test signal to each other, is employed for testing of the semiconductor package. The test apparatus has various configurations depending on the type of semiconductor package to be tested. The test apparatus and the semiconductor package are not directly connected to each other, but indirectly connected through a test socket.

Typical test sockets are a pogo socket and a rubber socket. Among them, the rubber socket has a configuration in which a conductive part (which is formed to have a configuration in which a plurality of electrically-conductive particles are contained in a material having elasticity such as silicon) is arranged inside an insulating part (which formed of a material having elasticity such as silicon) to be insulated from each other. Since such the rubber socket does not use a mechanical means such as soldering or a spring, it has excellent durability and has the advantage of achieving simple electrical connection, so it has been widely used in recent years.

In a test apparatus including the rubber socket type test socket, the amount of contact stroke of the test socket is determined depending on a vertical thickness of a stroke limiting part placed at a periphery of a pressurizing part of a pusher pressurizing the semiconductor package and a stopper part placed at a periphery of a conductive part of the test socket, a thickness of the semiconductor package, a height of the test socket, and the like.

However, the conventional test apparatus had difficulty in precise stroke control due to an addition of a thickness tolerance of the stroke limiting part, a thickness tolerance of the stopper part, a height tolerance of the test socket, and a thickness tolerance of the semiconductor package.

In addition, the conventional rubber socket type test socket has problems in that since the insulating part is formed of a non-conductive material, high-frequency signal interference between the conductive parts could not be avoided, and a desired impedance could not be obtained, whereby high-frequency signal transmission characteristics is degraded.

The above-described information disclosed in the background description is provided only for improving the understanding of the background of the present disclosure, and thus may include the information which does not constitute the prior art.

SUMMARY OF THE INVENTION

The present disclosure is conceived in the light of the above problems, an object of the present disclosure is to provide a test socket in which difficulty in stroke control due to thickness tolerance of a device under inspection is reduced, it is possible to precisely control the stroke is possible, and high-frequency signal transmission characteristics is excellent, a test apparatus including the same, and a method for manufacturing the test socket.

In order to achieve the above object, the present disclosure discloses a test socket configured to electrically connect a tester generating a test signal and a device under inspection to each other, this test socket may include a nonelastic electrically-conductive housing formed of a nonelastic electrically-conductive material and having a plurality of housing holes passing therethrough in a thickness direction; an insulating coating layer applied on at least an upper surface of the nonelastic electrically-conductive housing and a circumference of each of the plurality of housing hole; and an electrically-conductive part formed to have a configuration in which a plurality of electrically-conductive particles are contained in an elastic insulating material, disposed in the housing hole such that a lower end portion thereof may be connected to a signal electrode of the tester placed below the nonelastic electrically-conductive housing and an upper end portion thereof may be connected to the terminal of the device under inspection placed above the nonelastic electrically-conductive housing, and insulated from the nonelastic electrically-conductive housing by the insulating coating layer.

The insulating coating layer may be applied on the entire nonelastic electrically-conductive housing.

The insulating coating layer may be formed by a coating method selected from parylene coating, anodizing treatment, Teflon coating, and liquid silicone coating.

The housing hole may include a housing lower hole extending upward from a lower surface of the nonelastic electrically-conductive housing with a constant width; and a housing upper hole formed to have a shape in which a width thereof is gradually decreased downward from the upper surface of the nonelastic electrically-conductive housing, and being in communication with the housing lower hole.

In order to achieve the above object, meanwhile, a test socket according to another aspect of the present disclosure is configured to electrically connect a tester generating a test signal and a device under inspection to each other, and this test socket may include a nonelastic electrically-conductive housing formed of a nonelastic electrically-conductive material and having a plurality of housing holes passing therethrough in a thickness direction; an electrically-conductive part formed to have a configuration in which a plurality of electrically-conductive particles are contained in an elastic insulating material, and disposed in the housing hole such that a lower end portion thereof may be connected to a signal electrode of the tester placed below the nonelastic electrically-conductive housing and an upper end portion thereof may be connected to the terminal of the device under inspection placed above the nonelastic electrically-conductive housing; an insulating part formed of an elastic insulating material, and disposed between the nonelastic electrically-conductive housing and the electrically-conductive part to insulate the electrically-conductive part from the nonelastic electrically-conductive housing; and an upper insulating sheet formed of an insulating material, provided with an upper insulating sheet hole formed at a position corresponding to the electrically-conductive part, and coupled to an upper surface of the nonelastic electrically-conductive housing.

The electrically-conductive part may include an electrically-conductive part body placed in the housing hole, and an electrically-conductive part upper bump connected to the electrically-conductive part body and protruding from an upper surface of the nonelastic electrically-conductive housing, and the insulating part may include an insulating part body surrounding the electrically-conductive part body in the housing hole, and an insulating part upper bump connected to the insulating part body so as to protrude from the upper surface of the nonelastic electrically-conductive housing, thereby surrounding the electrically-conductive part upper bump.

The upper insulating sheet hole may be formed to have a tapered shape such that a width of at least a portion thereof is gradually decreased from an upper surface of the upper insulating sheet towards the nonelastic electrically-conductive housing.

The electrically-conductive part may include an electrically-conductive part body placed in the housing hole, and an electrically-conductive part upper bump connected to the electrically-conductive part body and protruding from an upper surface of the nonelastic electrically-conductive housing, the insulating part may include an insulating part body surrounding the electrically-conductive part body in the housing hole, and an insulating part upper bump connected to the insulating part body so as to protrude from the upper surface of the nonelastic electrically-conductive housing, thereby surrounding the electrically-conductive part upper bump, and the uppermost width of the upper insulating sheet hole may be larger than a width of the insulating part upper bump.

The test socket according to the present disclosure may further include a ground terminal protruding from a lower surface of the nonelastic electrically-conductive housing and coming into contact with a ground electrode so as to enable the nonelastic electrically-conductive housing to be electrically connected to the ground electrode provided in the tester.

The ground terminal may be formed to have a configuration in which a plurality of electrically-conductive particles are contained in an elastic insulating material.

The nonelastic electrically-conductive housing may be formed of metal.

The electrically-conductive part may include an electrically-conductive part body placed in the housing hole and an electrically-conductive part lower bump connected to the electrically-conductive part body and protruding from a lower surface of the nonelastic electrically-conductive housing, wherein the electrically-conductive part may satisfy the following condition:

$$0.05 \leq \frac{Lb}{Lt} \leq 0.5$$

(Lt: Length obtained by adding a length of the electrically-conductive part body and a length of the electrically-conductive part lower bump, and Lb: Length of the electrically-conductive part lower bump)

The test socket according to the present disclosure may further include a lower insulating sheet formed of an insulating material, provided with a lower insulating sheet hole formed at a position corresponding to the electrically-conductive part, and connected to the lower surface of the nonelastic electrically-conductive housing. The electrically-conductive part may pass through the lower insulating sheet hole to be connected to a signal electrode of the tester placed below the nonelastic electrically-conductive housing.

The test socket according to the present disclosure may further include a support frame coupled to one surface of the lower insulating sheet. The lower insulating sheet may be provided with a lower insulating sheet guide hole passing through the lower insulating sheet in a thickness direction, and the support frame may be provided with a support frame guide hole formed therein and being in communication with the lower insulating sheet guide hole.

In order to achieve the above object, on the other hand, the present disclosure discloses a test apparatus configured to connect a device under inspection having a terminal to a tester, which generates a test signal, to test the device under inspection, and this test apparatus may include a test socket configured to electrically connect the tester and the device under inspection to each other such that the test signal of the tester can be transmitted to the device under inspection; and a pusher configured to be moved towards the tester or moved away from the tester to provide a pressurizing force by which the device under inspection disposed on the test socket may be pressurized towards the tester. Here, the test socket may include a nonelastic electrically-conductive housing formed of a nonelastic electrically-conductive material and having a plurality of housing holes passing therethrough in a thickness direction; an insulating coating layer applied on at least an upper surface of the nonelastic electrically-conductive housing and a circumference of each of the plurality of housing hole; and an electrically-conductive part formed to have a configuration in which a plurality of electrically-conductive particles are contained in an elastic insulating material, disposed in the housing hole such that a lower end portion thereof may be connected to a signal electrode of the tester placed below the nonelastic electrically-conductive housing and an upper end portion thereof may be connected to the terminal of the device under inspection placed above the nonelastic electrically-conductive housing, and insulated from the nonelastic electrically-conductive housing by the insulating coating layer.

In order to achieve the above object, furthermore, a test apparatus according to another aspect of the present disclosure is configured to connect a device under inspection having a terminal to a tester, which generates a test signal, to test the device under inspection, and this test apparatus may include a test socket configured to electrically connect the tester and the device under inspection to each other such that the test signal of the tester can be transmitted to the device under inspection; and a pusher configured to be moved towards the tester or moved away from the tester to provide a pressurizing force by which the device under inspection disposed on the test socket may be pressurized towards the tester. Here, the test socket may include a nonelastic electrically-conductive housing formed of a nonelastic electrically-conductive material and having a plurality of housing holes passing therethrough in a thickness direction; an electrically-conductive part formed to have a configuration in which a plurality of electrically-conductive particles are contained in an elastic insulating material, and disposed in the housing hole such that a lower end portion thereof may be connected to a signal electrode of the tester placed below the nonelastic electrically-conductive housing and an upper end portion thereof may be connected to the terminal of the device under inspection placed above the nonelastic electrically-conductive housing; an insulating part formed of an elastic insulating material, and disposed between the nonelastic electrically-conductive housing and the electrically-conductive part to insulate the electrically-conductive part from the nonelastic electrically-conductive housing; and an upper insulating sheet formed of an insulating material, provided with an upper insulating sheet hole formed at a position corresponding to the electrically-conductive part, and coupled to an upper surface of the nonelastic electrically-conductive housing.

The test apparatus according to the present disclosure may further include a buffering part disposed between the pusher and the device under inspection so as to buffer a pressure applied to the device under inspection by the pusher.

Meanwhile, in order to achieve the above object, the present disclosure discloses a method for manufacturing a test socket configured to electrically connect a tester generating a test signal and a device under inspection having a terminal, and this method may include (a) preparing a nonelastic electrically-conductive member formed of a nonelastic electrically-conductive material; (b) forming a plurality of housing holes in the nonelastic electrically-conductive member to form a nonelastic electrically-conductive housing, the plurality of housing holes passing through the nonelastic electrically-conductive member; (c) coating at least an upper surface of the nonelastic electrically-conductive housing and a circumference of each of the plurality housing holes with an insulating coating layer; and (d) forming an electrically-conductive part, in which a plurality of electrically-conductive particles are contained in an elastic insulating material, in an insulating part hole to be insulated from nonelastic electrically-conductive housing by the insulating coating layer.

In the step (c), the insulating coating layer may be formed by a coating method selected from parylene coating, anodizing treatment, Teflon coating, and liquid silicone coating.

In the step (d), the electrically-conductive part may be formed to satisfy the following condition:

$$0.05 \le \frac{Lb}{Lt} \le 0.5$$

(Lt is a length obtained by adding a length of an electrically-conductive part body placed in the housing hole and a length of an electrically-conductive part lower bump connected to the electrically-conductive part body and protruding from a lower surface of the nonelastic electrically-conductive housing, and Lb is a length of the electrically-conductive part lower bump)

The step (d) may include filling the plurality of housing holes with an electrically-conductive particle mixture in which a plurality of electrically-conductive particles are contained in an elastic insulating material; preparing a mold having a plurality of mold holes corresponding to the plurality of housing holes, and filling the plurality of mold holes with the electrically-conductive particle mixture; coupling the mold to a lower surface of the nonelastic electrically-conductive housing to correspond the plurality of mold holes to the plurality of housing holes in a one-to-one relation; and integrally curing the electrically-conductive particle mixture received in the housing holes and the mold holes.

The method for manufacturing a test socket according to the present disclosure may further including, after the step (a), forming a ground terminal on a lower surface of the nonelastic electrically-conductive housing, the ground terminal being formed to have a configuration in which a plurality of electrically-conductive particles are contained in an elastic insulating material, and protruding from the lower surface of the nonelastic electrically-conductive housing and coming into contact with a ground electrode so as to enable the nonelastic electrically-conductive housing to be electrically connected to the ground electrode provided in the tester.

In the test apparatus according to the present disclosure, the test socket including the nonelastic electrically-conductive housing formed of a nonelastic electrically-conductive material and supporting the plurality of electrically-conductive parts is used to electrically connect the tester and the device under inspection, so that the pressurizing force of the pusher may be evenly applied between the device under inspection and the test socket and between the test socket and the tester.

Further, in the test apparatus according to the present disclosure, when the pusher pressurizes the device under inspection, the electrically-conductive part bump protruding from a lower surface of the nonelastic electrically-conductive housing may be elastically deformed to provide a stroke required to connect the terminal of the device under inspection to the tester.

Therefore, difficulty in stroke control occurred in a conventional technique using a rubber socket type test socket due to a thickness tolerance of a stroke restricting part, a thickness tolerance of a stopper part of the test socket, a height tolerance of the test socket, a thickness tolerance of the device under inspection, or the like is reduced, and it is possible to precisely control the stroke.

In addition, the test socket according to the present disclosure takes a coaxial cable structure because the insulating part surrounds the electrically-conductive part transmitting a signal and the nonelastic electrically-conductive housing surrounds a circumference of the insulating part. Accordingly, high-frequency signal transmission characteristics are excellent, and high-frequency signal interference between the electrically-conductive parts is small, so that signal transmission loss can be minimized.

In addition, the test socket according to the present disclosure is advantageous for high-speed signal transmission because characteristic impedance matching is possible by adjusting a diameter of the electrically-conductive part or a distance between the electrically-conductive part and the nonelastic electrically-conductive housing.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
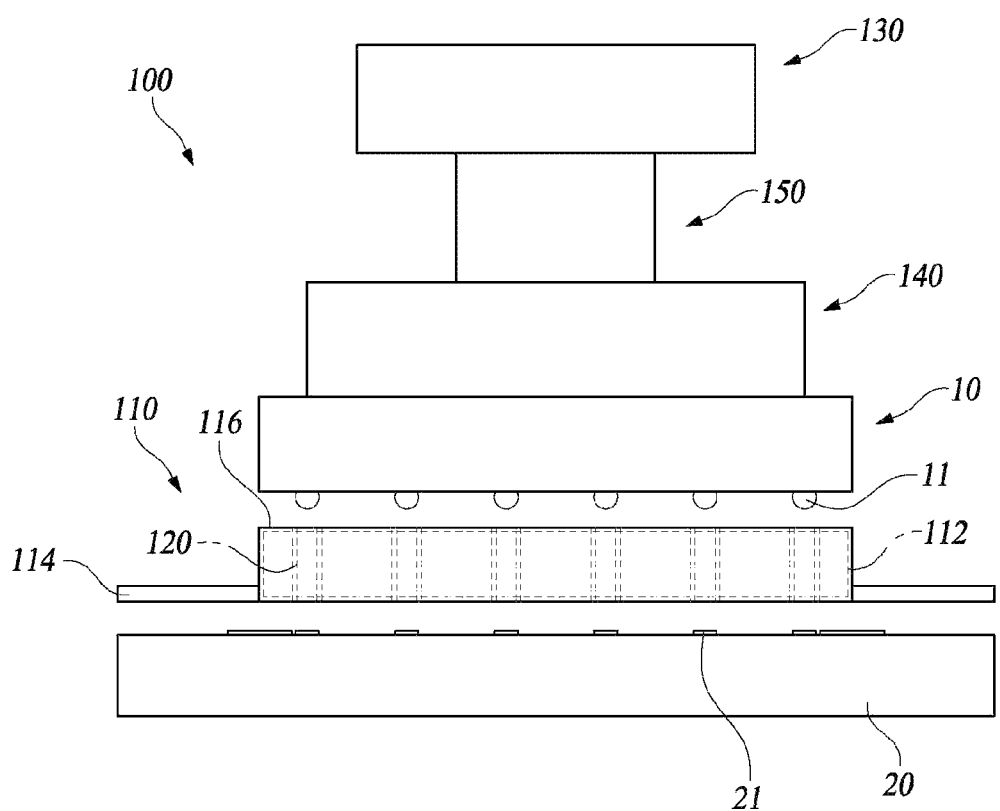
FIG. 1 is a front view illustrating a test apparatus according to one embodiment of the present disclosure.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Hereinafter, a test socket, a test apparatus including the same, and a method for manufacturing the test socket according to preferred embodiments of the present disclosure are be elucidated in detail with reference to the drawings.

Figure 2:
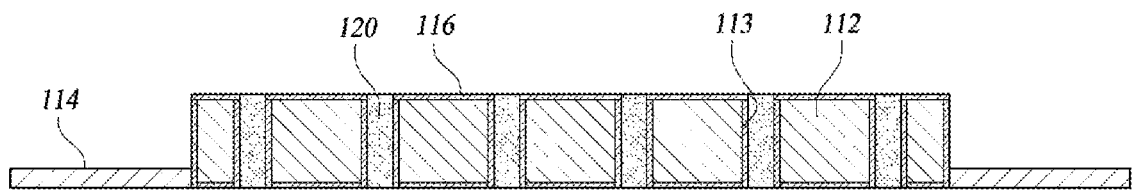
FIG. 2 is a front cross-sectional view illustrating a test socket provided in the test apparatus according to one embodiment of the present disclosure.
Figure 3:
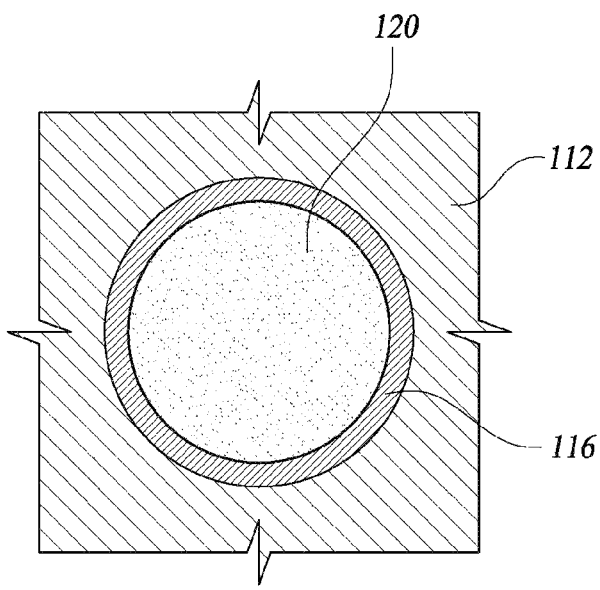
FIG. 3 is a top cross-sectional view illustrating the test socket provided in the test apparatus according to one embodiment of the present disclosure.

FIG. 1 is a front view illustrating a test apparatus according to one embodiment of the present disclosure, FIG. 2 is a front cross-sectional view illustrating a test socket provided in the test apparatus according to one embodiment of the present disclosure, and FIG. 3 is a top cross-sectional view illustrating a portion of the test socket provided in the test apparatus according to one embodiment of the present disclosure.

As illustrated in the drawings, a test apparatus 100 according to one embodiment of the present disclosure is provided for connecting a device 10 under inspection having a terminal 11 to a tester 20 generating a test signal to test the device 10 under inspection, and the above test apparatus includes a test socket 110 configured to electrically connect the tester 20 and the device 10 under inspection to each other and a pusher 130 for pressurizing the device 10 under inspection placed on the test socket 110 towards the tester 20.

The test socket 110 includes a nonelastic electrically-conductive housing 112 having a plurality of housing holes 113 formed therein, an insulating coating layer 116 applied on the nonelastic electrically-conductive housing 112, and a plurality of electrically-conductive parts 120 disposed in the plurality of housing holes 113 so as to pass through the nonelastic electrically-conductive housing 112 in a thickness direction.

The nonelastic electrically-conductive housing 112 is from a nonelastic electrically-conductive material. As the nonelastic electrically-conductive material constituting the nonelastic electrically-conductive housing 112, a conductive metal such as aluminum, copper, brass, SUS, iron, nickel or the like, or various materials having electrical conductivity and nonelastic property may be used. The plurality of housing holes 113 provided in the nonelastic electrically-conductive housing 112 are formed to pass through the nonelastic electrically-conductive housing 112 in the thickness direction. As illustrated in the drawings, a support frame 114 may be coupled to the nonelastic electrically-conductive housing 112.

The insulating coating layer 116 is applied on the nonelastic electrically-conductive housing 112 in the form of a thin film having a uniform thickness. At least an upper surface of the nonelastic electrically-conductive housing 112 and a circumference of each of the plurality of housing holes 113 are coated with the insulating coating layer 116. The insulating coating layer 116 applied on the upper surface of the nonelastic electrically-conductive housing 112 may insulate the nonelastic electrically-conductive housing 112 from the device 10 under inspection disposed on the nonelastic electrically-conductive housing. The insulating coating layer 116 applied on the circumference of each housing hole 113 insulates the electrically-conductive part 120 disposed in the housing hole 113 from the nonelastic electrically-conductive housing 112. The insulating coating layer 116 may be applied on the nonelastic electrically-conductive housing 112 by a coating method selected from parylene coating, anodizing treatment, Teflon coating, and liquid silicone coating.

The parylene coating is a method of forming powdered dimer into a polymer-type insulating layer using chemical vapor deposition (CVD), and it is possible to form the insulating coating layer 116 on the nonelastic electrically-conductive housing 112 by using the above method. The parylene coating method may include A process in which powered dimer is evaporated by heat, a process in which evaporated dimer is converted into a gaseous state through a pyrolysis unit, a process in which before diffused into a vacuum chamber, gaseous (monomer) dimer is cooled, and a process in which cooled gas particles are polymerized in a vacuum chamber and then applied as a film to a surface of a surface of an object to be treated. Since the polymerization reaction of the parylene coating occurs at a very low pressure and at room temperature, thermal stress is not generated on the surface of the object to be treated. Unlike a wet coating method, when the parylene coating is performed, coating is made even in fine minute gaps, and a uniform insulating film may be formed regardless of shape such as sharp needles, holes, corners, edges, fine holes and the like.

Among the anodizing treatment methods, a hard anodizing is a method for converting an aluminum metal surface into alumina ceramic using an electrochemical technique, and the insulating coating layer 116 may be formed on the nonelastic electrically-conductive housing 112 using this hard anodizing method. When aluminum metal is subjected to hard anodizing, the aluminum metal itself is oxidized and converted into alumina ceramic. Alumina ceramic has excellent abrasion resistance, does not cause peeling problems like plating or painting, and has excellent electrical insulation performance.

The Teflon coating is a method of coating a fluorocarbon resin and applying it on a material such as a metal and the like. It is possible to form the insulating coating layer 116 on the nonelastic electrically-conductive housing 112 using such Teflon coating. The insulating coating layer 116 applied on the nonelastic electrically-conductive housing 112 through the Teflon coating has insulation properties.

When the liquid silicone coating method is employed, by immersing the nonelastic electrically-conductive housing 112 in liquefied silicone liquid, it is possible to form the insulating coating layer 116 consisting of a silicone film on the nonelastic electrically-conductive housing 112.

In addition to the above, various other methods may be used to form the insulating coating layer 116 on the nonelastic electrically-conductive housing 112.

As illustrated in the drawings, the insulating coating layer 116 disposed on the upper surface of the nonelastic electrically-conductive housing 112 insulates the device 10 under inspection and the nonelastic electrically-conductive housing 112, and the insulating coating layer 116 disposed on a lower upper surface of the nonelastic electrically-conductive housing 112 insulates the tester 20 and the nonelastic electrically-conductive housing 112. In addition, the insulating coating layer 116 disposed on the circumference of the housing hole 113 of the nonelastic electrically-conductive housing 112 may insulate the electrically-conductive part 120 and the nonelastic electrically-conductive housing 112.

The electrically-conductive part 120 may be formed to have a configuration in which a plurality of electrically-conductive particles are contained in an elastic insulating material such that it can be connected to a signal electrode 21 of the tester 20 and the terminal 11 of the device 10 under inspection. The electrically-conductive part 120 is disposed in the housing hole 113 to pass through the nonelastic electrically-conductive housing 112 in the thickness direction. The electrically-conductive part 120 comes into contact with the insulating coating layer 116 disposed on the circumference of the housing hole 113 and is insulated from the nonelastic electrically-conductive housing 112 by the insulating coating layer 116.

As the electrically-conductive part 120 is disposed in the housing hole 113, a lower end portion thereof may be connected to the signal electrode 21 of the tester 20 placed below the nonelastic electrically-conductive housing 112, and an upper end portion may be connected to the terminal 11 of the device 10 under inspection placed above the nonelastic electrically-conductive housing 112.

As an elastic insulating material constituting the electrically-conductive part 120, a heat-resistant polymer material having a crosslinked structure, for example, silicone rubber, polybutadiene rubber, natural rubber, polyisoprene rubber, styrene-butadiene copolymer rubber, acrylonitrile-butadiene copolymer rubber, styrene-butadiene-diene block copolymer rubber, styrene-isoprene block copolymer rubber, urethane rubber, polyester rubber, epichlorohydrin rubber, ethylene-propylene copolymer rubber, ethylene-propylene-Diene copolymer rubber, soft liquid epoxy rubber, and the like may be employed.

In addition, as the electrically-conductive particles constituting the electrically-conductive part 120, particles having magnetism may be employed such that is may be reacted by a magnetic field. For example, as the electrically-conductive particles, particles obtained by plating a surface of core particle, for example, particles of metals exhibiting magnetism, such as iron, nickel, cobalt, etc., or alloy particles thereof, or particles containing these metals, or particles of these metals, with a metal having excellent electrical-conductivity, such as gold, silver, palladium, radium, or the like; particles obtained by plating a surface of core particle, for example, non-magnetic metal particles, inorganic substance particles such as glass beads or the like, and polymer particles, with electrically-conductive magnetic substance such as nickel, cobalt, or the like; or particles obtained by plating core particle with electrically-conductive magnetic substance and a metal having excellent electrical-conductivity may be employed.

In the test socket 110 configured as above, the nonelastic electrically-conductive housing 112 supports the plurality of electrically-conductive parts 120 electrically connecting the signal electrode 21 of the tester 20 and the terminal 11 of the device 10 under inspection to each other, such that when pressurized towards the tester 20 by the pusher 130, the nonelastic electrically-conductive housing 112 may come into contact with the tester 20 to function as a stopper.

Accordingly, difficulty in stroke control occurred in a conventional rubber socket type test socket due to a thickness tolerance of a stroke limiting part, a thickness tolerance of a stopper part of the test socket, a height tolerance of the test socket, a thickness tolerance of the device under inspection, or the like is reduced.

In addition, since the insulating coating layer 116 surrounds the electrically-conductive part 120 transmitting a signal and the nonelastic electrically-conductive housing 112 surrounds a circumference of the insulating layer 116, the test socket 100 according to one embodiment of the present disclosure takes a coaxial cable structure as shown in FIG. 3. Accordingly, a high-frequency signal transmission characteristic is excellent, and high-frequency signal interference between the electrically-conductive parts 120 is small, so that a signal transmission loss may be minimized.

In addition, characteristic impedance matching may be achieved by adjusting a diameter of the electrically-conductive part 120 or a distance between the electrically-conductive part 120 and the nonelastic electrically-conductive housing 112, so the test socket 110 according to one embodiment of the present disclosure is advantageous for high-speed signal transmission.

The pusher 130 is configured to be moved towards the tester 20 or moved away from the tester 20 to provide a pressurizing force by which the device 10 under inspection disposed on the test socket 110 may be pressurized towards the tester 20. The pusher 130 may receive a moving force from a driving part (not shown) to be moved.

A pressurizing part 140 and a buffering part 150 are provided below the pusher 130, and the pusher 130 may pressurize the device 10 under inspection through the pressurizing part 140 and the buffering part 150. The pressurizing part 140 comes into contact with an upper surface of the device 10 under inspection to transmit the pressurizing force of the pusher 130 to the device 10 under inspection. The buffering part 150 serves to buffer a pressure applied to the device 10 under inspection by the pusher 130. The pressurizing part 140 comes into contact with the upper surface of the device 10 under inspection to transmit a pressurizing force of the pusher 130 to the device 10 under inspection. The buffering part 150 serves to buffer a pressure applied to the device 10 under inspection by the pusher 130. The buffering 150 may be made of a material having elasticity such as rubber, silicone or the like, or may take various configurations capable of absorbing shock, such as a structure including a spring or the like.

When the pressurizing part 140 pressurizes the device 10 under inspection, load applied to the device 10 under inspection, the test socket 110 and the test 20 by the pusher 130 may be restricted due to a buffering action of the buffering part 150 so as not to be excessive. Accordingly, damage or breakage of the device 10 under inspection, the test socket 110, or the tester 20 caused by the excessive pressurizing force can be prevented.

Figure 4:
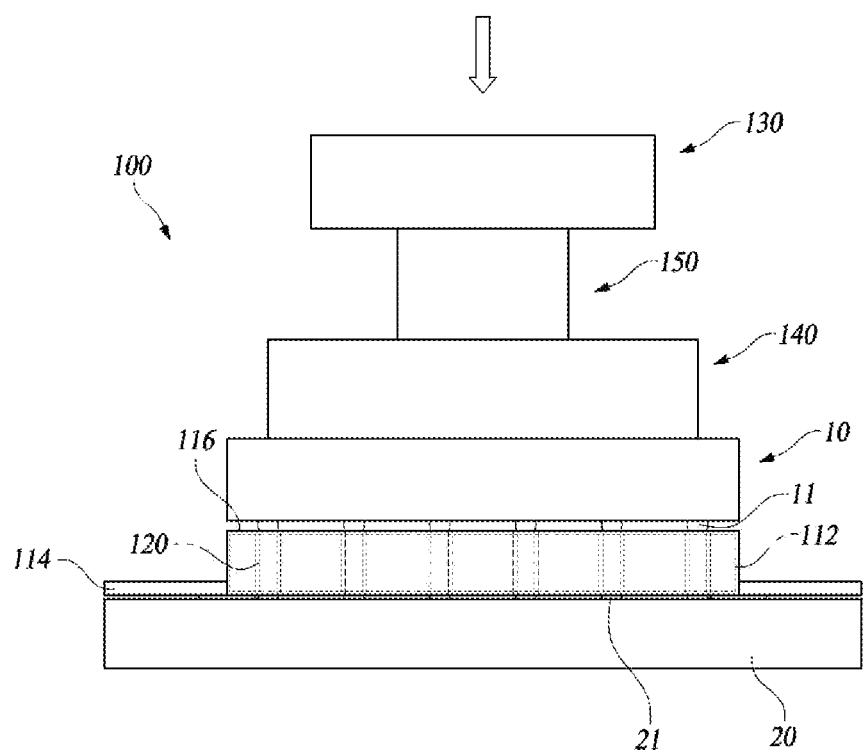
FIG. 4 is a view for describing operation of the test apparatus according to one embodiment of the present disclosure.

As shown in FIG. 4, when the pusher 130 pressurizes the device 10 under inspection towards the test socket 110 via the pressurizing part 140 and the buffering part 150, the terminal 11 of the device 10 under inspection is crimped to an upper end portion of the electrically-conductive part 120 and a lower end portion of the electrically-conductive part 120 is crimped to the signal electrode 21 of the tester 20. At this time, a test signal generated in the tester 20 may be transmitted to the device 10 under inspection through the test socket 110 to perform an electrical test for the device 10 under inspection.

Since the electrically-conductive part 120 has an elastic force, when the terminal 11 of the device 10 under inspection is crimped to the electrically-conductive part 120, the terminal 11 may enter inside the housing hole 113 while elastically deforming the electrically-conductive part 120. At this time, a lower surface of the device 10 under inspection may come into contact with the upper surface of the nonelastic electrically-conductive housing 112. In addition, the lower surface of the nonelastic electrically-conductive housing 112 comes into contact with an upper surface of the tester 20 by the pressurizing force generated when the device 10 under inspection pressurizes the test socket 110. As the lower surface of the nonelastic electrically-conductive housing 112 comes into contact with the upper surface of the tester 20, the stroke is not further increased.

As described above, by contacting the lower surface of the device 10 under inspection with the upper surface of the nonelastic electrically-conductive housing 112 to pressurize the test socket 110 towards the tester 20, the pressurizing force applied to the device 10 under inspection may be evenly transmitted to the entire test socket 110 and the plurality of electrically-conductive parts 120 may maintain a contact state with the plurality of signal electrodes 21 and the plurality of terminals 11 with an overall even contact intensity. Accordingly, a stable connection state between the plurality of signal electrodes 21 and the plurality of terminals 11 may be maintained through the test socket 110, so a stable test may be performed without generating signal transmission loss.

On the other hand, while the pusher 130 pressurizes the device 10 under inspection towards the tester 20, the buffering part 150 is elastically deformed after a lower surface of the test socket 110 touches the tester 20, so a stroke is not further applied. In addition, as the buffering part 150 buffers the pressurizing force of the pusher 130, damage or breakage of the device 10 under inspection, the test socket 110, or the tester 20 caused by the excessive pressurizing force may be prevented.

In addition to the method of employing the buffering part 150 to prevent the excessive pressurizing force from being applied to the device 10 under inspection after the lower surface of the nonelastic electrically-conductive housing 112 comes into contact with the tester 20, it is also possible to feedback-control the pusher 130 by installing a sensor capable of sensing the pressurizing force. Additionally, a method of using a pneumatic cylinder in which a pressure can be controlled, a method of controlling a motor capable of sensing a pressurizing force, or the like may be employed to prevent the excessive pressurizing force from being applied to the device 10 under inspection.

In the test apparatus 100 according to one embodiment of the present disclosure, as described above, by using the test socket 110 including the nonelastic electrically-conductive housing 112 which is formed of a nonelastic conductive material and supports the plurality of electrically-conductive parts 120 to electrically connect the tester 20 and the device 10 under inspection to each other, the pressurizing force of the pusher 130 may be evenly applied between the device 10 under inspection and the test socket 110 and between the test socket 110 and the tester 20.

In addition, in the test apparatus 100 according to one embodiment of the present disclosure, the nonelastic electrically-conductive housing 112 of the test socket 110 serves as a stopper. In contrast with a conventional rubber socket type test socket, therefore, difficulty in stroke control caused by a thickness tolerance of a stroke limiting part, a thickness tolerance of a stopper part of the test socket, a height tolerance of the test socket, a thickness tolerance of the device under inspection, and the like is reduced, and a precise control of the stroke is possible. In addition, a life characteristic of the test socket 110 may be improved by a precise control of the stroke.

Figure 5:
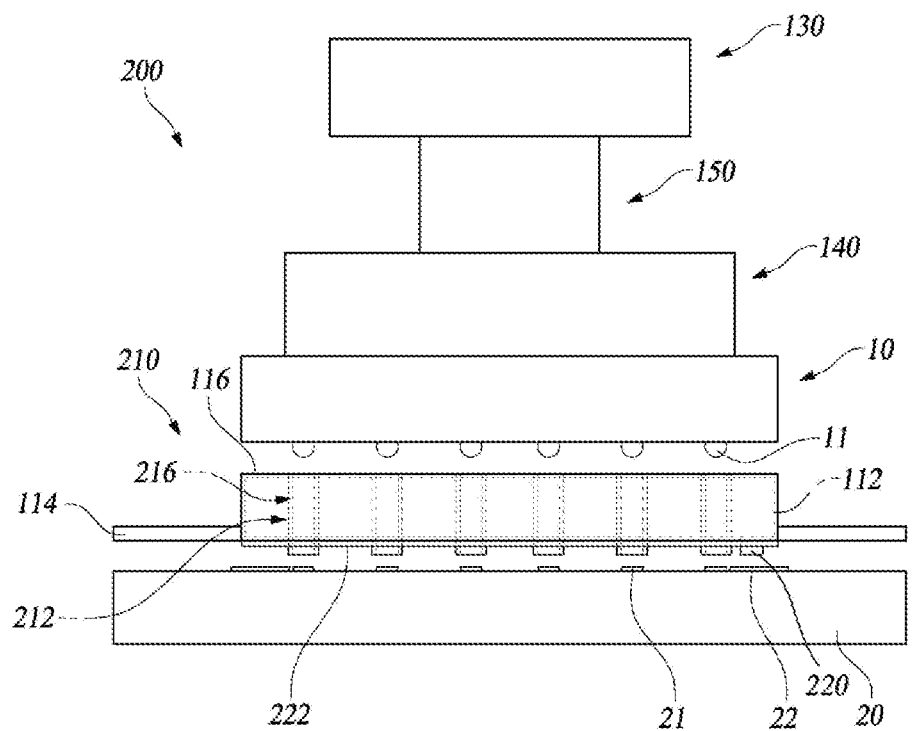
FIG. 5 is a front view illustrating a test apparatus according to another embodiment of the present disclosure.
Figure 6:
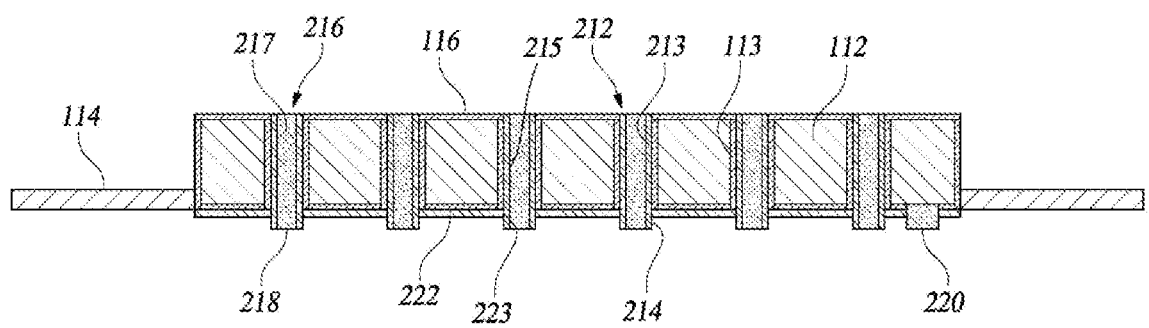
FIG. 6 is a front cross-sectional view illustrating a test socket provided in the test apparatus shown in FIG. 5.

Meanwhile, FIG. 5 is a front view illustrating a test apparatus according to another embodiment of the present disclosure, and FIG. 6 is a front cross-sectional view illustrating a test socket provided in the test apparatus shown in FIG. 5.

A test apparatus 200 shown in FIG. 5 includes a test socket 210 configured to electrically connect the tester 20 and the device 10 under inspection to each other, the pusher 130 provided for pressurizing the device 10 under inspection placed on the test socket 110 towards the tester 20, the pressurizing part 140 provided between the pusher 130 and the device 10 under inspection to transmit the pressurizing force of the pusher 130 to the device 10 under inspection, and the buffering part 150. Here, the pusher 130, the pressurizing part 140, and the buffering part 150 are the same as those described above.

The test socket 210 includes the nonelastic electrically-conductive housing 112 having the plurality of housing holes 113 formed therein, the insulating coating layer 116 applied on the nonelastic electrically-conductive housing 112, a plurality of insulating parts 212 disposed in the plurality of housing holes 113, respectively, a plurality of electrically-conductive parts 216 supported on the plurality of insulating parts 212 so as to pass through the nonelastic electrically-conductive housing 122 in the thickness direction, and a ground terminal 220 and a lower insulating sheet 222 disposed on the lower surface of the nonelastic electrically-conductive housing 112. Here, the nonelastic electrically-conductive housing 112 and the insulating coating layer 116 are the same as those described above.

The insulating part 212 includes an insulating part body 213 placed in the housing hole 113, and an insulating part lower bump 214 extending downward from the insulating part body 213 so as to protrude from the lower surface of the nonelastic electrically-conductive housing 112. The insulating part 212 comes into contact with the insulating coating layer 116 in the housing hole 113. An insulating part hole 215 which is parallel with the housing hole 113 is provided inside the insulating part 212.

The electrically-conductive part 216 may be formed to have a configuration in which a plurality of electrically-conductive particles are contained in an elastic insulating material such that it can be connected to the signal electrode 21 of the tester 20 and the terminal 11 of the device 10 under inspection. As the electrically-conductive part 216 is supported by the insulating part 212 and disposed in the housing hole 113, it may pass through the nonelastic electrically-conductive housing 112 in the thickness direction.

The electrically-conductive part 216 includes an electrically-conductive part body 217 placed in the housing hole 113 and an electrically-conductive part lower bump 218 that is connected to the electrically-conductive part body 217 and protrudes from the lower surface of the nonelastic electrically-conductive housing 112. The electrically-conductive part body 217 is surrounded by the insulating part body 213 of the insulating part 212, and the electrically-conductive part lower bump 218 is surrounded by the insulating part lower bump 214 of the insulating part 212.

The ground terminal 220 protrudes from the lower surface of the nonelastic electrically-conductive housing 112, in order to enable it to come into contact with a ground electrode 22 provided in the tester 20. The ground terminal 220 electrically connects the nonelastic electrically-conductive housing 112 and the ground electrode 22 provided in the tester 20.

The ground terminal 226 may be formed to have a configuration, similar to that of the electrically-conductive part 216, in which a plurality of electrically-conductive particles are contained in an elastic insulating material, or may be made of another electrically-conductive material.

The lower insulating sheet 222 is made of an insulating material and covers the lower surface of the nonelastic electrically-conductive housing 112. In the lower insulating sheet 222, a plurality of lower insulating sheet holes 223 into which the electrically-conductive part 216 or the ground terminal 220 is inserted are formed. The lower insulating sheet 222 functions to prevent a short-circuit defect in which the lower surface of the nonelastic electrically-conductive housing 112 comes into contact with and the signal electrode 21 of the tester 20.

In the above test socket 210, by supporting the plurality of electrically-conductive parts 216 electrically connecting the signal electrode 21 of the tester 20 and the terminal 11 of the device 10 under inspection on the nonelastic electrically-conductive housing 112, only the insulating part lower bump 214 and the electrically-conductive part lower bump 218 protruding from the lower surface of the nonelastic electrically-conductive housing 112 may be elastically deformed when pressurized towards the tester 20 by the pusher 130.

Accordingly, in contrast with a conventional rubber socket type test socket, difficulty in stroke control caused by a thickness tolerance of a stroke limiting part, a thickness tolerance of a stopper part of the test socket, a height tolerance of the test socket, a thickness tolerance of the device under inspection, and the like is reduced.

Figure 7:
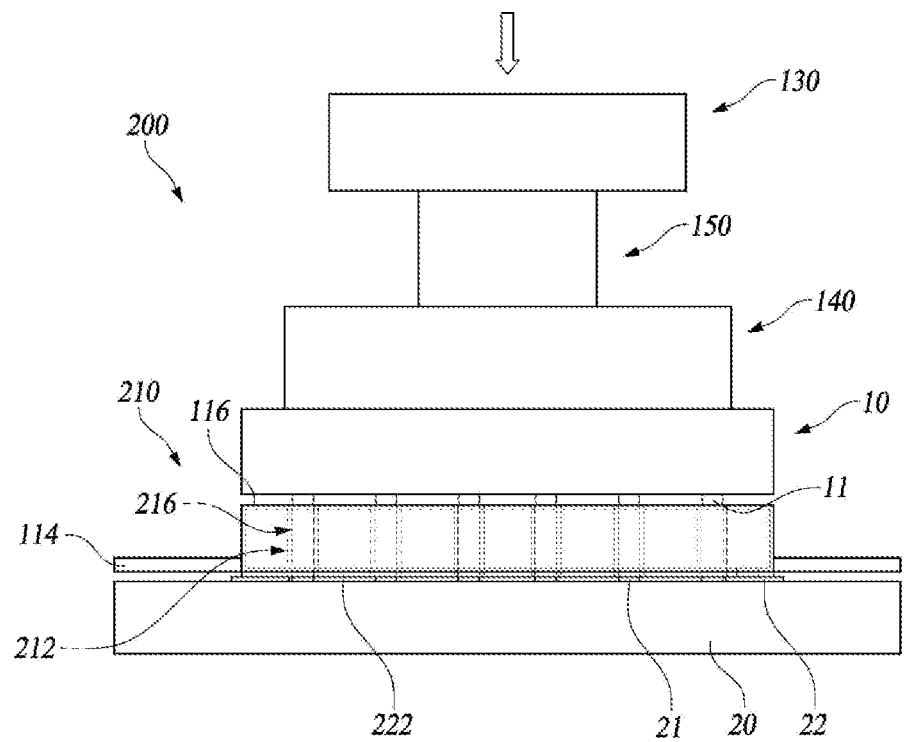
FIG. 7 is a view for describing operation of the test apparatus shown in FIG. 5.

As shown in FIG. 7, when the pusher 130 pressurizes the device 10 under inspection towards the test socket 210 through the pressurizing 140 and the buffering part 150, the lower surface of the device 10 under inspection comes into contact with the upper surface of the nonelastic electrically-conductive housing 112, and the insulating part lower bump 214 and the electrically-conductive part lower bump 218 are compressed until the nonelastic electrically-conductive housing 112 reaches the tester 20. In addition, the ground terminal 220 is connected to the ground electrode 22 of the tester 20, and so the nonelastic electrically-conductive housing 112 is grounded. As the test socket 210 is grounded as described above, noise is not generated between the plurality of electrically-conductive parts 216 provided in the test socket 210 and the signal transmission efficiency may be improved.

Figure 8:
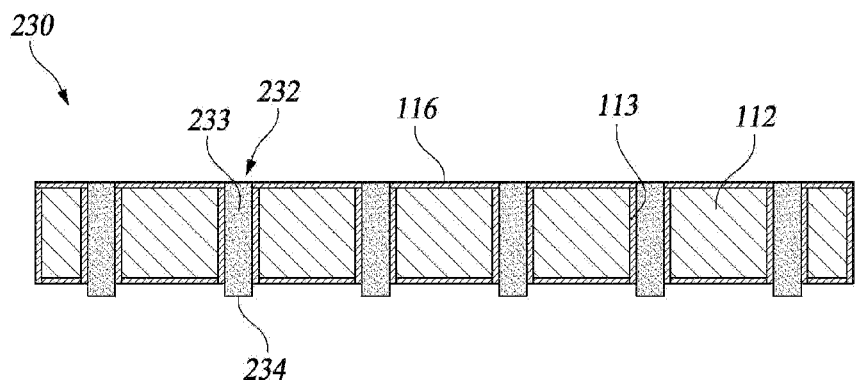
FIG. 8 is a front cross-sectional view illustrating a test socket according to still another embodiment of the present disclosure.

Meanwhile, FIG. 8 is a front cross-sectional view illustrating a test socket according to still another embodiment of the present disclosure.

A test socket 230 shown in FIG. 8 includes the nonelastic electrically-conductive housing 112 having the plurality of housing holes 113 formed therein, the insulating coating layer 116 applied on the nonelastic electrically-conductive housing 112, and a plurality of electrically-conductive parts 232 disposed in the plurality of housing holes 113, respectively, and passing through the nonelastic electrically-conductive housing 112 in the thickness direction. Here, the nonelastic electrically-conductive housing 112 and the insulating coating layer 116 are the same as those described above.

The electrically-conductive part 232 may be formed to have a configuration in which a plurality of electrically-conductive particles are contained in an elastic insulating material such that it can be connected to the signal electrode 21 of the tester 20 and the terminal 11 of the device 10 under inspection. As the electrically-conductive part 232 is disposed in the housing hole 113, it may pass through the nonelastic electrically-conductive housing 112 in the thickness direction.

The electrically-conductive part 232 includes an electrically-conductive part body 233 placed in the housing hole 113 and an electrically-conductive part lower bump 234 that is connected to the electrically-conductive part body 233 and protrudes from the lower surface of the nonelastic electrically-conductive housing 112.

Figure 9:
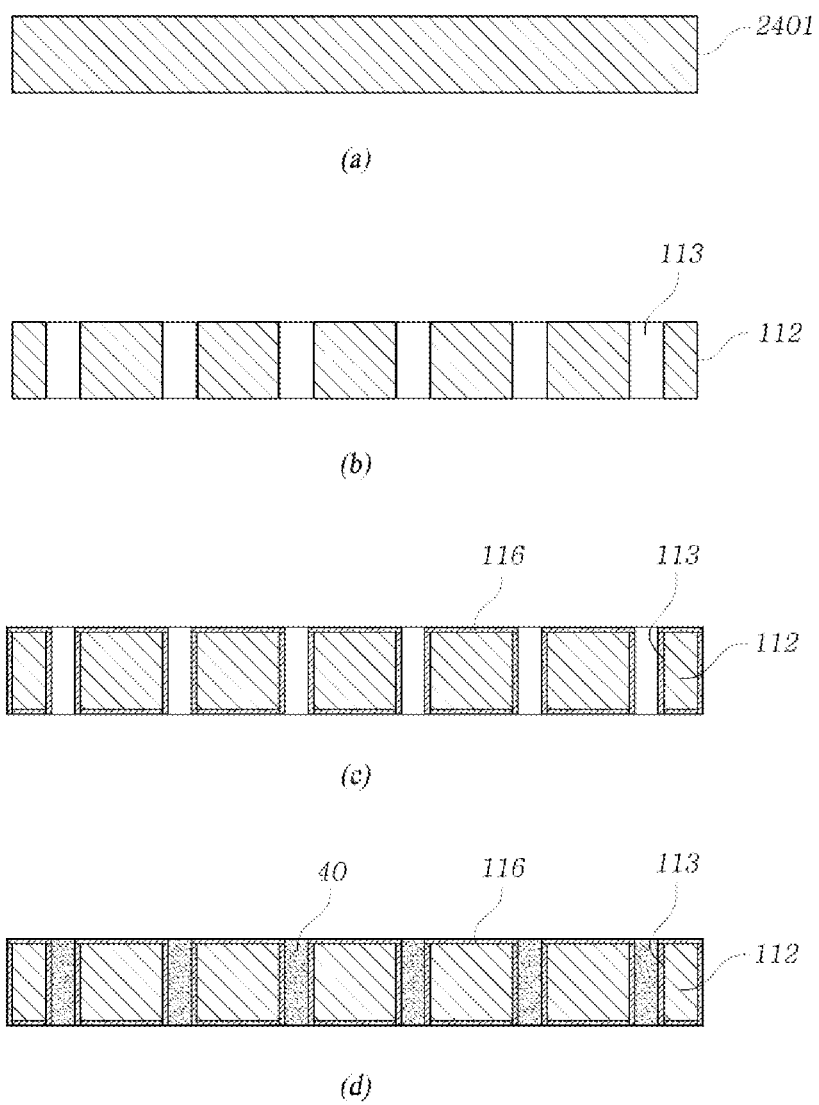
FIG. 9 and FIG. 10 illustrate a process for manufacturing the test socket shown in FIG. 8.
Figure 10:
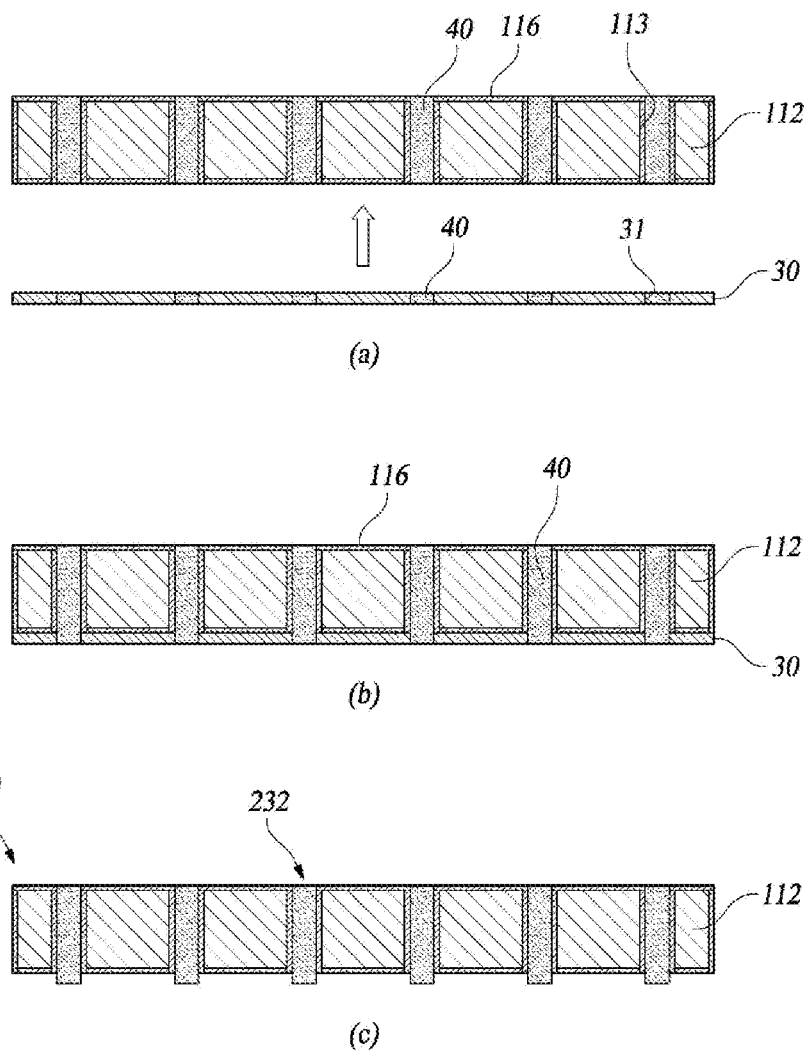

The above test socket 230 may be manufactured in the same manner as shown in FIG. 9 and FIG. 10.

First, as illustrated in FIG. 9A, a nonelastic electrically-conductive member 2401 formed of a nonelastic electrically-conductive material is prepared.

Next, as shown in FIG. 9B, the plurality of housing holes 113 passing through the nonelastic electrically-conductive member 2401 in the thickness direction are formed in the nonelastic electrically-conductive member 2401 to form the nonelastic electrically-conductive housing 112.

Then, as shown in FIG. 9C, the nonelastic electrically-conductive housing 112 is coated with the insulating coating layer 116. As a method for applying the insulating coating layer 116 on the nonelastic electrically-conductive housing 112, parylene coating, anodizing treatment, Teflon coating, liquid silicone coating, or the like as described above may be employed.

Next, as shown in of FIG. 9D, the plurality of housing holes 113 are filled with an electrically-conductive particle mixture 40 in which electrically-conductive particles are contained in an elastic insulating material. The electrically-conductive particle mixture 40 may be pressed into the housing holes 113 in the form of a paste having fluidity.

Then, as shown in FIG. 10A, a mold 30 having a plurality of mold holes 31 corresponding to the housing holes 113 of the nonelastic electrically-conductive housing 112 is prepared, and the plurality of mold holes 31 is then filled with the electrically-conductive particle mixture 40. The electrically-conductive particle mixture 40 may be pressed into the mold holes 113 in the form of a paste having fluidity.

Next, as shown in FIG. 10B, the mold 30 in which the electrically-conductive particle mixture 40 is disposed is coupled to the nonelastic electrically-conductive housing 112 filled with the electrically-conductive particle mixture 40. At this time, the mold 30 is coupled to the nonelastic electrically-conductive housing 112 such that the plurality of mold holes 31 correspond to the plurality of housing holes 113 in a one-to-one relation. In addition, a curing process is performed in a state in which the electrically-conductive particle mixture 40 disposed in the housing holes 113 is connected to the electrically-conductive particle mixture 40 disposed in the mold 30. As a method for curing the electrically-conductive particle mixture 40, various methods such as a method in which the particle mixture is heated to a certain temperature and then cooled to a room temperature, may be employed depending on the characteristics of the electrically-conductive particle mixture 40.

As the electrically-conductive particle mixture 40 is cured through a curing process, the electrically-conductive part 232, which includes the electrically-conductive part body 233 disposed in the housing hole 113 and the electrically-conductive part lower bump 234 disposed in the mold hole 31, is formed.

Next, as illustrated in FIG. 10C, the test socket 230 may be completed by removing the mold 30.

In the method of manufacturing the test socket 230 as descried above, a process of applying a magnetic field to the electrically-conductive particle mixture 40 may be performed before curing the electrically-conductive particle mixture 40. If the magnetic field is applied to the electrically-conductive particle mixture 40, the electrically-conductive particles dispersed in the elastic insulating material may oriented in the thickness direction of the nonelastic electrically-conductive housing 112 under the influence of the magnetic field to form an electrical path.

In addition, in the method for manufacturing the test socket 230, the electrically-conductive part body 233 and the electrically-conductive part lower bump 234 of the electrically-conductive part 232 may be formed simultaneously in one forming mold.

Meanwhile, FIGS. 11 to 18 illustrate various modifications of the test socket.

Figure 11:
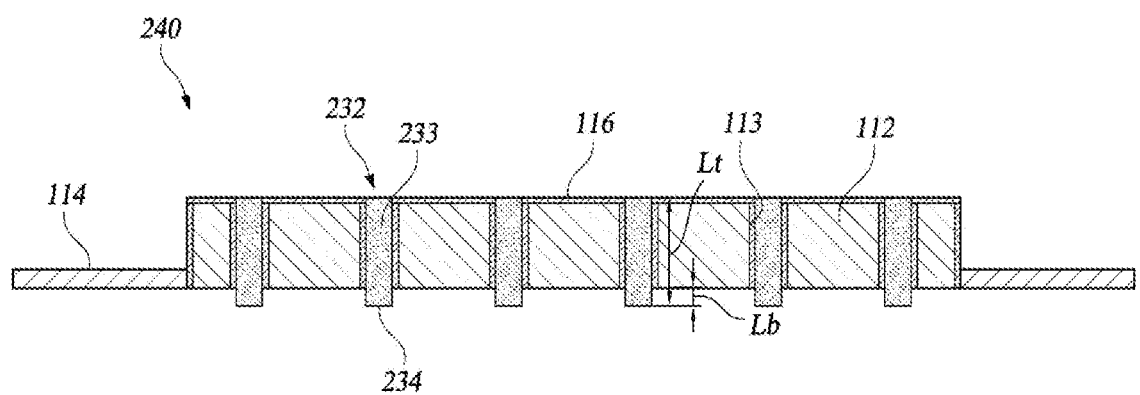
FIGS. 11 to 18 illustrate various modifications of the test socket.

First, the test socket 240 shown in FIG. 11 includes the nonelastic electrically-conductive housing 112 having the plurality of housing holes 113 formed therein, the insulating coating layer 116 applied on the nonelastic electrically-conductive housing 112, and the plurality of electrically-conductive parts 232 disposed in the housing holes 113, respectively, and passing through the nonelastic electrically-conductive housing 112 in the thickness direction.

As compared with the test socket 230 shown in FIG. 8, in this test socket 240, the insulating coating layer 116 is formed on a portion of the nonelastic electrically-conductive housing 112. That is, the insulating coating layer 116 is formed on the upper surface of the nonelastic electrically-conductive housing 112 and the circumference of each of the plurality of housing holes 113.

The electrically-conductive part 232 may be formed to have a configuration in which a plurality of electrically-conductive particles are contained in an elastic insulating material, and includes the electrically-conductive part body 233 and the electrically-conductive part lower bump 234.

The electrically-conductive part 232 has a structural feature as below.

$$0.05 \le \frac{Lb}{Lt} \le 0.5$$

Here, Lt is a length obtained by adding a length of the electrically-conductive part body 233 and a length of the electrically-conductive part lower bump 234, and Lb represents a length of the electrically-conductive part lower bump 234.

The electrically-conductive part 232 having the above configuration may smoothly provide a stroke necessary to connect the terminal 11 of the device 10 under inspection to the tester 20. In addition, the electrically-conductive part 232 including the electrically-conductive part lower bump 234 distributes the load when the terminal 11 of the device 10 under inspection comes into contact therewith, so that this is advantageous for preventing damage to the device under inspection.

That is, the electrically-conductive part lower pump 234 protruding from the lower surface of the nonelastic electrically-conductive housing 112 has a relatively high degree of freedom because it does not have a portion held by the nonelastic electrically-conductive housing 112 or the insulating part. Accordingly, if the electrically-conductive part lower pump 234 is designed to have an appropriate length, it is possible to induce a fine movement of the test socket 230 when the device 10 under inspection comes into contact therewith. In addition, if the test socket 230 is finely moved upward, downward, forward, backward or from side to side when the device 10 under inspection comes into contact therewith, it is possible to obtain an effect of distributing a load caused by according to the contact of the device 10 under inspection and buffering an impact.

A length of the electrically-conductive part lower bump 234 may be appropriately determined according to a width or the number of the electrically-conductive part 232. If a length of the electrically-conductive part lower bump 234 is too short, fine movement of the test socket 230 cannot be induced, and if a length of the electrically-conductive part lower bump 234 is too long, there is a problem in that durability is deteriorated. Therefore, it is preferable that a length of the electrically-conductive part lower bump 234 is determined to satisfy the following condition, as described above.

$$0.05 \le \frac{Lb}{Lt} \le 0.5$$

When a ratio of the length Lb of the electrically-conductive part lower bump 234 to the length Lt which is a sum of a length of the electrically-conductive part body 233 and a length of the electrically-conductive part lower bump 234 is less than 0.05, it is difficult to smoothly provide a stroke required to connect the terminal 11 of the device 10 under inspection to the tester 20, and it is not possible to induce fine movement of the test socket 230, so there is no load distribution effect.

On the other hand, when a ratio of the length Lb of the electrically-conductive part lower bump 234 to the length Lt which is a sum of a length of the electrically-conductive part body 233 and a length of the electrically-conductive part lower bump 234 exceeds 0.05, there are problems that durability of the test socket 230 is deteriorated and product life is shortened. That is, if the length Lb of the electrically-conductive part lower bump 234 is too long, when contacting with the device 10 under inspection, the electrically-conductive part lower bump 234 is bent, whereby the conductive part lower bumps 234 come into contact with each other to cause a short failure or the conductive part lower bump 234 may be damaged.

Figure 12:
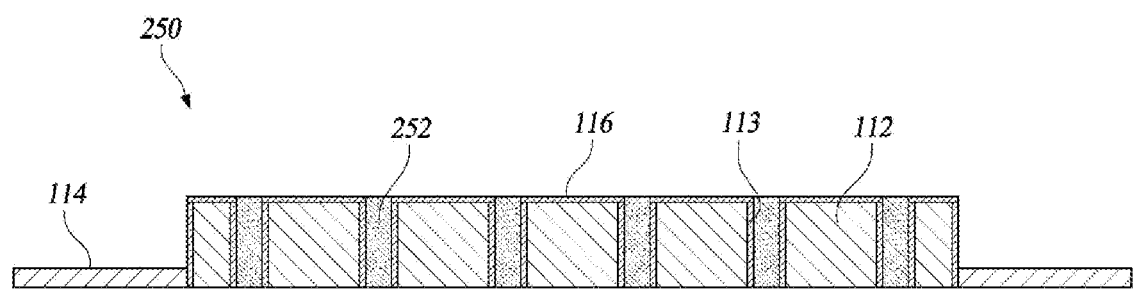

A test socket 250 depicted in FIG. 12 includes the nonelastic electrically-conductive housing 112 having the plurality of housing holes 113 formed therein, the insulating coating layer 116 applied on the nonelastic electrically-conductive housing 112, and a plurality of electrically-conductive part 252 disposed in the plurality of housing holes 113, respectively and passing through the nonelastic electrically-conductive housing 112 in the thickness direction.

In this test socket 250, as compared to the test socket 240 shown in FIG. 11, the electrically-conductive part 252 has a slightly modified configuration. The electrically-conductive part 252 has a configuration with no electrically-conductive part lower bump.

Figure 13:
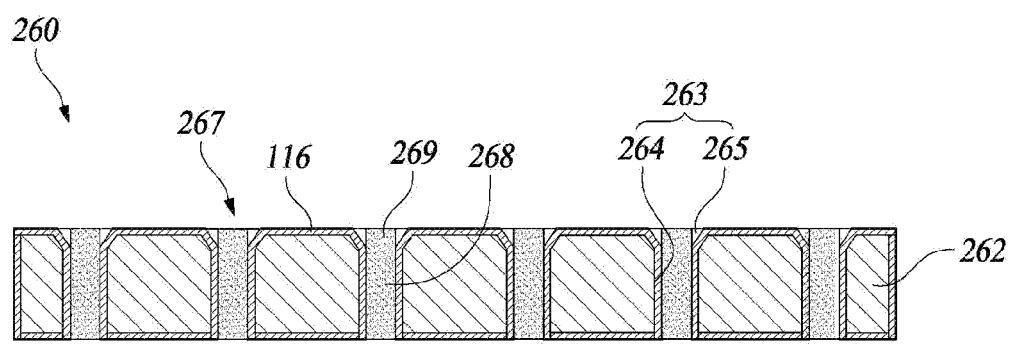
Figure 14:
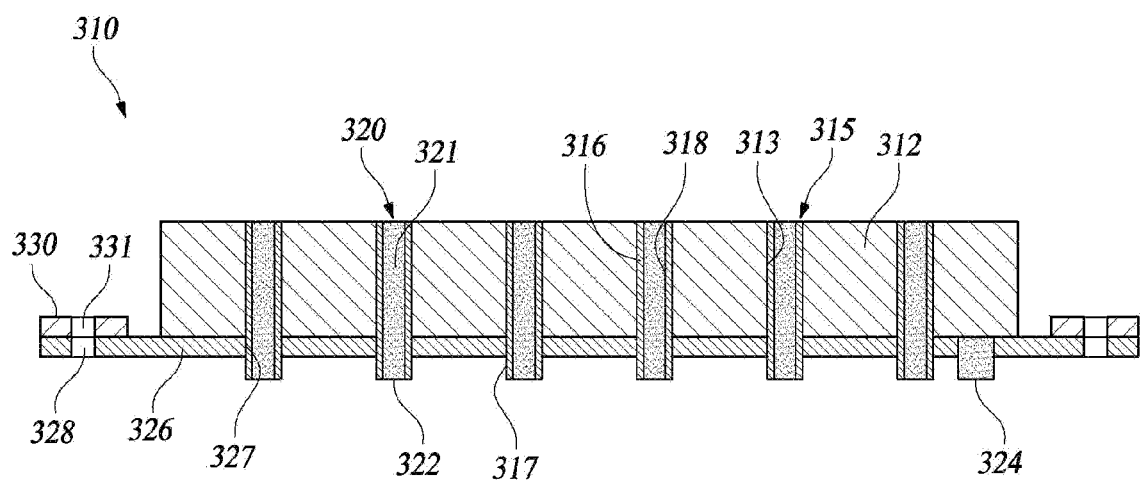
Figure 15:
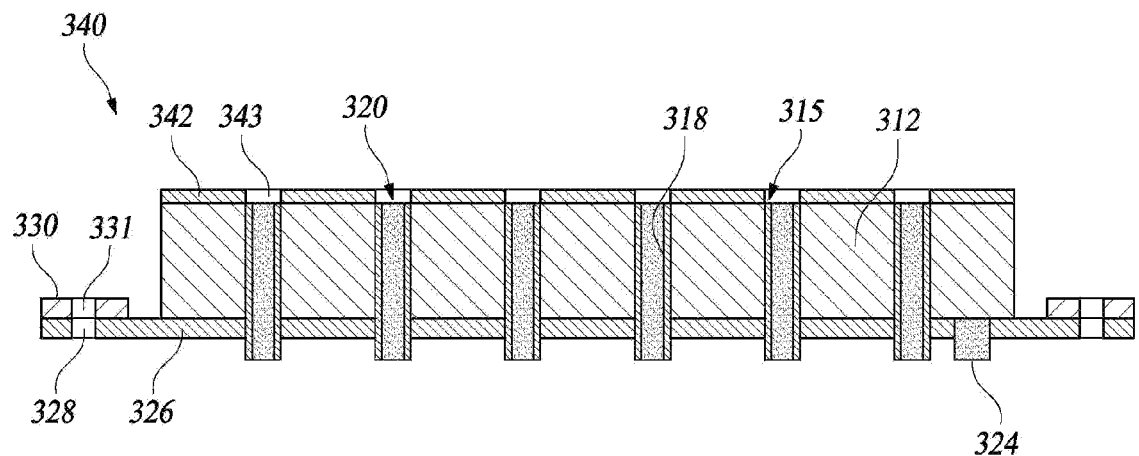

A test socket 260 shown in FIG. 13 includes a nonelastic electrically-conductive housing 262 having a plurality of housing holes 262 formed therein, the insulating coating layer 116 applied on the nonelastic electrically-conductive housing 262, and a plurality of electrically-conductive part 267 disposed in the plurality of housing holes 263, respectively and passing through the nonelastic electrically-conductive housing 262 in the thickness direction. Here, the insulating coating layer 116 is the same as that described above.

The nonelastic electrically-conductive housing 262 is formed of a nonelastic electrically-conductive material as described above. The plurality of housing holes 263 are is formed to pass through the nonelastic electrically-conductive housing 262 in the thickness direction. The housing hole 263 includes a housing lower hole 264 extending upward from a lower surface of the nonelastic electrically-conductive housing 262 with a constant width, and a housing upper hole 265 extending downward from an upper surface of the nonelastic electrically-conductive housing 262 and being in communication with the housing lower hole 264. The housing upper hole 265 is formed to have a tapered shape in which a width thereof is gradually decreased downward from the upper surface of the nonelastic electrically-conductive housing 262.

The electrically-conductive part 267 may be formed to have a configuration in which a plurality of electrically-conductive particles are contained in an elastic insulating material, and is disposed in the housing hole 263 to be insulated by the insulating coating layer 116. The electrically-conductive part 267 includes an electrically-conductive part body 268 placed in the housing lower hole 264, and an electrically-conductive part upper bump 269 connected to the electrically-conductive part body 268 and placed in the housing upper hole 265. A width of each of the electrically-conductive part body 268 and the electrically-conductive part upper bump 269 is the same as that of the housing lower hole 264. Accordingly, a space is provided between the electrically-conductive part upper bump 269 and the nonelastic electrically-conductive housing 262.

The upper insulating sheet 342 is formed of an insulating material, and includes a plurality of upper insulating sheet holes 343 formed at positions corresponding to the plurality of electrically-conductive parts 320. The upper insulating sheet 342 may insulate between the nonelastic electrically-conductive housing 312 and the device 10 under inspection placed thereon.

Figure 16:
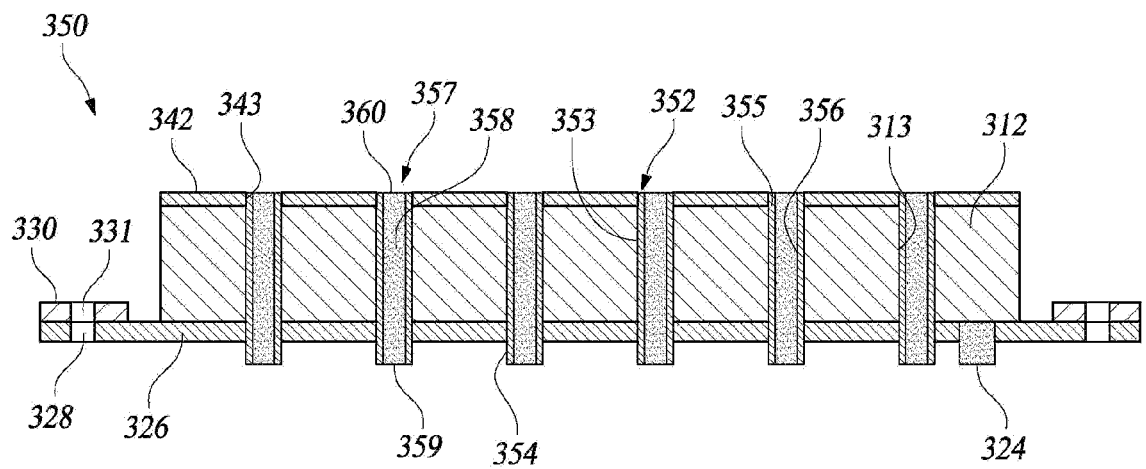

A test socket 350 shown in FIG. 16 includes the nonelastic electrically-conductive housing 312 having the plurality of housing holes 313 formed therein, a plurality of insulating parts 352 disposed in the plurality of housing holes 313, respectively, a plurality of electrically-conductive parts 357 supported on the insulating parts 352 so as to pass through the nonelastic electrically-conductive housing 312 in the thickness direction, the ground terminal 324 and the lower insulating sheet 326 disposed on the lower surface of the nonelastic electrically-conductive housing 312, and the upper insulating sheet 342 disposed on the upper surface of the nonelastic electrically-conductive housing 312. As compared with the test socket 340 shown in FIG. 15, this test socket 350 has the insulating part 352 and the electrically-conductive part 357 which have the modified configuration, and the rest of the configuration is the same as that described above.

The insulating part 315 includes an insulating part body 353 placed in the housing hole 313, an insulating part lower bump 354 extending downward from the insulating part body 353 so as to protrude from the lower surface of the nonelastic electrically-conductive housing 312, and an insulating part upper bump 355 extending upward from the insulating part body 353 so as to protrude from the upper surface of the nonelastic electrically-conductive housing 312. An insulating part hole 356 which is parallel with the housing hole 313 is provided inside the insulating part 352. The insulating part upper bump 355 is placed in the upper insulating sheet hole 343 of the upper insulating sheet 342.

The electrically-conductive part 357 may be formed to have a configuration in which a plurality of electrically-conductive particles are contained in an elastic insulating material. The electrically-conductive part 357 includes an electrically-conductive part body 358 placed in the housing hole 313, an electrically-conductive part lower bump 359 connected to the electrically-conductive part body 358 and protruding from the lower surface of the nonelastic electrically-conductive housing 312, and an electrically-conductive part upper bump 360 connected to the electrically-conductive part body 358 and protruding from the upper surface of the nonelastic electrically-conductive housing 312. The electrically-conductive part body 358 is surrounded by the insulating part body 353 of the insulating part 352, the electrically-conductive part lower bump 359 is surrounded by the insulating part lower bump 354, and the electrically-conductive part upper bump 360 is surrounded by the insulating part upper bump 355.

Figure 17:
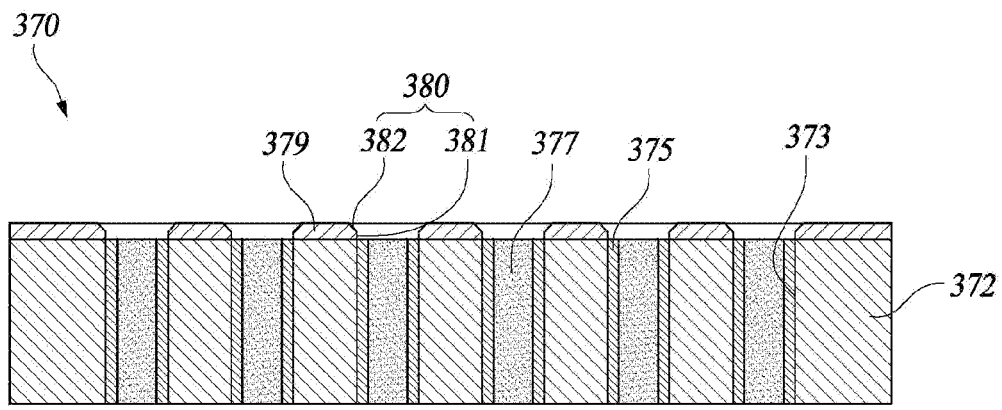

A test socket 370 shown in FIG. 17 includes a nonelastic electrically-conductive housing 372 having a plurality of housing holes 373 formed therein, a plurality of insulating parts 375 disposed in the plurality of housing holes 373, respectively, a plurality of electrically-conductive parts 377 supported on the insulating parts 375 so as to pass through the nonelastic electrically-conductive housing 372 in the thickness direction, and an upper insulating sheet 379 disposed on an upper surface of the nonelastic electrically-conductive housing 372.

The electrically-conductive part 377 is formed of an electrically-conductive particle mixture obtained by electrically-conductive particles contained in an elastic insulating material. The electrically-conductive part 377 may be obtained by filling the plurality of housing holes 373 with the electrically-conductive particle mixture, placing a magnet, which is smaller than a width of the housing hole 373, at a position corresponding to each of the housing holes 373, and applying a magnetic field to the electrically-conductive particle mixture. That is, conductive particles in the electrically-conductive particle mixture are collected at a center of the housing hole 373 by a magnetic field of the magnet and are then aligned in the thickness direction of the inelastic conductive housing 372 to form the electrically-conductive part 377. In addition, only an elastic insulating material is remained on a circumference of the electrically-conductive part 377, and this elastic insulating material is cured to form the insulating part 375.

The upper insulating sheet 379 is formed of an insulating material and provided with a plurality of upper insulating sheet holes 380 formed at positions corresponding to the plurality of conductive parts 377. The upper insulating sheet hole 380 is formed to have a tapered shape such that a width of at least a portion thereof is gradually decreased from an upper surface of the upper insulating sheet 379 towards the nonelastic electrically-conductive housing 372. That is, the upper insulating sheet hole 380 includes an insulating sheet lower hole 381 extending from a lower surface of the upper insulating sheet 379 to an upper surface of the upper insulating sheet 379 with the same width as the housing hole 373, and an insulating sheet upper hole 382 extending from the upper surface of the upper insulating sheet 379 to the lower surface of the upper insulating sheet 379 and being in communication with the insulating sheet lower hole 381. The insulating sheet upper hole 382 is formed to have a tapered shape such that a width thereof is gradually decreased from the upper surface of the upper insulating sheet 379 towards the insulating sheet lower hole 381.

In the above test socket 370, since the upper insulating sheet hole 380 is formed to have a tapered shape, when the device 10 under inspection approaches the test socket 370, the terminal 11 of the device 10 under inspection may be guided by the upper insulating sheet 379 to more stably come into contact with the electrically-conductive part 377.

Figure 18:
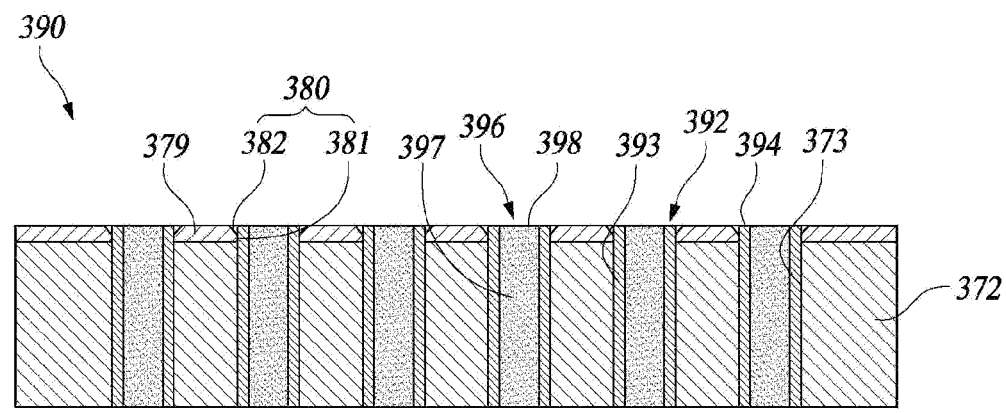

A test socket 390 shown in FIG. 18 includes the nonelastic electrically-conductive housing 372 having the plurality of housing holes 373 formed therein, a plurality of insulating parts 392 disposed in the plurality of housing holes 373, respectively, a plurality of electrically-conductive parts 396 supported on the insulating parts 392 so as to pass through the nonelastic electrically-conductive housing 372 in the thickness direction, and the upper insulating sheet 379 disposed on the upper surface of the nonelastic electrically-conductive housing 372. Here, the nonelastic electrically-conductive housing 372 and the upper insulating sheet 379 are the same as those as shown in FIG. 17.

The insulating part 392 includes an insulating part body 393 placed in the housing hole 373 and an insulating part upper bump 394 extending upward from the insulating part body 393 so as to protrude from the upper surface of the nonelastic electrically-conductive housing 372. The insulating part upper bump 394 is placed in the insulating sheet upper hole 382 of the upper insulating sheet 379. The uppermost width of the upper insulating sheet hole 380 is larger than a width of the insulating part upper bump 394, so a space is provided between the upper insulating sheet 379 and the insulating part upper bump 394.

The electrically-conductive part 396 may be formed to have a configuration in which a plurality of electrically-conductive particles are contained in an elastic insulating material. The electrically-conductive part 396 includes an electrically-conductive part body 397 placed in the housing hole 373 and an electrically-conductive part upper bump 398 connected to the electrically-conductive part body 397 and protruding from the upper surface of the nonelastic electrically-conductive housing 372. The electrically-conductive part body 397 is surrounded by the insulating part body 393 of the insulating part 392, and the electrically-conductive part upper bump 398 is surrounded by the insulating part upper bump 394.

Although the present disclosure has been described with a preferred example, a scope of the present disclosure is not limited to the form described and illustrated above.

For example, an insulating coating layer applied on the nonelastic electrically-conductive housing may be formed only on the upper surface of the nonelastic electrically-conductive housing and the circumference of the housing hole, or may be formed only the circumference of the housing hole.

In addition, the pressure transmission configuration configured to transmit the pressurizing force of the pusher 130 to the device 10 under inspection is not limited to that illustrated in the drawings, and may be variously modified.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A test socket configured to electrically connect a tester generating a test signal and a device under inspection to each other, the test socket comprising:
    a nonelastic electrically-conductive housing formed of a nonelastic electrically-conductive material and having a plurality of housing holes passing therethrough in a thickness direction;
    an insulating coating layer applied on at least an upper surface of the nonelastic electrically-conductive housing and a circumference of each of the plurality of housing hole; and
    an electrically-conductive part formed in the housing hole such that a lower end portion thereof may be connected to a signal electrode of the tester placed below the nonelastic electrically-conductive housing and an upper end portion thereof may be connected to the terminal of the device under inspection placed above the nonelastic electrically-conductive housing, and insulated from the nonelastic electrically-conductive housing by the insulating coating layer,
    wherein a plurality of electrically-conductive particles are contained in an elastic insulating material and oriented in the thickness direction by magnetic field in the housing hole.

2. The test socket of claim 1, wherein the insulating coating layer is applied on the entire nonelastic electrically-conductive housing.

3. The test socket of claim 1, wherein the insulating coating layer is formed by a coating method selected from the group consisting of parylene coating, anodizing treatment, Teflon coating, and liquid silicone coating.

4. The test socket of claim 1, wherein the housing hole comprises:
    a housing lower hole extending upward from a lower surface of the nonelastic electrically-conductive housing with a constant width; and
    a housing upper hole formed to have a shape in which a width thereof is gradually decreased downward from the upper surface of the nonelastic electrically-conductive housing, and being in communication with the housing lower hole.

5. The test socket of claim 1, further comprising a ground terminal protruding from a lower surface of the nonelastic electrically-conductive housing and coming into contact with a ground electrode so as to enable the nonelastic electrically-conductive housing to be electrically connected to the ground electrode provided in the tester.

6. The test socket of claim 5, wherein the ground terminal is formed to have a configuration in which a plurality of electrically-conductive particles are contained in an elastic insulating material.

7. The test socket of claim 1, wherein the nonelastic electrically-conductive housing is formed of metal.

8. The test socket of claim 1, wherein the electrically-conductive part comprises:
    an electrically-conductive part body placed in the housing hole; and
    an electrically-conductive part lower bump connected to the electrically-conductive part body and protruding from a lower surface of the nonelastic electrically-conductive housing,
    wherein the electrically-conductive part satisfies the following condition:

$$0.05 \le \frac{Lb}{Lt} \le 0.5$$

here, Lt is a length obtained by adding a length of the electrically-conductive part body and a length of the electrically-conductive part lower bump, and Lb is a length of the electrically-conductive part lower bump.

9. The test socket of claim 1, further comprising a lower insulating sheet formed of an insulating material, provided with a lower insulating sheet hole formed at a position corresponding to the electrically-conductive part, and connected to the lower surface of the nonelastic electrically-conductive housing,
    wherein the electrically-conductive part passes through the lower insulating sheet hole to be connected to a signal electrode of the tester placed below the nonelastic electrically-conductive housing.

10. The test socket of claim 9, further comprising a support frame coupled to one surface of the lower insulating sheet,
    wherein the lower insulating sheet is provided with a lower insulating sheet guide hole passing through the lower insulating sheet in a thickness direction, and the support frame is provided with a support frame guide hole formed therein and being in communication with the lower insulating sheet guide hole.

11. A test socket configured to electrically connect a tester generating a test signal and a device under inspection to each other, the test socket comprising:
    a nonelastic electrically-conductive housing formed of a nonelastic electrically-conductive material and having a plurality of housing holes passing therethrough in a thickness direction;
    an electrically-conductive part formed in the housing hole such that a lower end portion thereof may be connected to a signal electrode of the tester placed below the nonelastic electrically-conductive housing and an upper end portion thereof may be connected to the terminal of the device under inspection placed above the nonelastic electrically-conductive housing;
    an insulating part formed of an elastic insulating material, and disposed between the nonelastic electrically-conductive housing and the electrically-conductive part to insulate the electrically-conductive part from the nonelastic electrically-conductive housing; and
    an upper insulating sheet formed of an insulating material, provided with an upper insulating sheet hole formed at a position corresponding to the electrically-conductive part, and coupled to an upper surface of the nonelastic electrically-conductive housing,
    wherein a plurality of electrically-conductive particles are contained in an elastic insulating material and oriented in the thickness direction by magnetic field in the housing hole.

12. The test socket of claim 11, wherein the electrically-conductive part comprises:
    an electrically-conductive part body placed in the housing hole; and
    an electrically-conductive part upper bump connected to the electrically-conductive part body and protruding from an upper surface of the nonelastic electrically-conductive housing,
    wherein the insulating part comprises:
        an insulating part body surrounding the electrically-conductive part body in the housing hole; and an insulating part upper bump connected to the insulating part body so as to protrude from the upper surface of the nonelastic electrically-conductive housing, thereby surrounding the electrically-conductive part upper bump.

13. The test socket of claim 11, wherein the upper insulating sheet hole is formed to have a tapered shape such that a width of at least a portion thereof is gradually decreased from an upper surface of the upper insulating sheet towards the nonelastic electrically-conductive housing.

14. The test socket of claim 13, wherein the electrically-conductive part comprises:
an electrically-conductive part body placed in the housing hole; and
an electrically-conductive part upper bump connected to the electrically-conductive part body and protruding from an upper surface of the nonelastic electrically-conductive housing,
wherein the insulating part comprises:
an insulating part body surrounding the electrically-conductive part body in the housing hole; and
an insulating part upper bump connected to the insulating part body so as to protrude from the upper surface of the nonelastic electrically-conductive housing, thereby surrounding the electrically-conductive part upper bump,
wherein the uppermost width of the upper insulating sheet hole is larger than a width of the insulating part upper bump.

15. A test apparatus configured to connect a device under inspection having a terminal to a tester, which generates a test signal, to test the device under inspection, the test apparatus comprising:
a test socket configured to electrically connect the tester and the device under inspection to each other such that the test signal of the tester can be transmitted to the device under inspection; and
a pusher configured to be moved towards the tester or moved away from the tester to provide a pressurizing force by which the device under inspection disposed on the test socket may be pressurized towards the tester,
wherein the test socket comprises:
a nonelastic electrically-conductive housing formed of a nonelastic electrically-conductive material and having a plurality of housing holes passing therethrough in a thickness direction;
an insulating coating layer applied on at least an upper surface of the nonelastic electrically-conductive housing and a circumference of each of the plurality of housing hole; and
an electrically-conductive part formed in the housing hole such that a lower end portion thereof may be connected to a signal electrode of the tester placed below the nonelastic electrically-conductive housing and an upper end portion thereof may be connected to the terminal of the device under inspection placed above the nonelastic electrically-conductive housing, and insulated from the nonelastic electrically-conductive housing by the insulating coating layer,
wherein a plurality of electrically-conductive particles are contained in an elastic insulating material and oriented in the thickness direction by magnetic field in the housing hole.

16. The test apparatus of claim 15, further comprising a buffering part disposed between the pusher and the device under inspection so as to buffer a pressure applied to the device under inspection by the pusher.

17. A test apparatus configured to connect a device under inspection having a terminal to a tester, which generates a test signal, to test the device under inspection, the test apparatus comprising:
a test socket configured to electrically connect the tester and the device under inspection to each other such that the test signal of the tester can be transmitted to the device under inspection; and
a pusher configured to be moved towards the tester or moved away from the tester to provide a pressurizing force by which the device under inspection disposed on the test socket may be pressurized towards the tester,
wherein the test socket comprises:
a nonelastic electrically-conductive housing formed of a nonelastic electrically-conductive material and having a plurality of housing holes passing therethrough in a thickness direction;
an electrically-conductive part formed in the housing hole such that a lower end portion thereof may be connected to a signal electrode of the tester placed below the nonelastic electrically-conductive housing and an upper end portion thereof may be connected to the terminal of the device under inspection placed above the nonelastic electrically-conductive housing;
an insulating part formed of an elastic insulating material, and disposed between the nonelastic electrically-conductive housing and the electrically-conductive part to insulate the electrically-conductive part from the nonelastic electrically-conductive housing; and
an upper insulating sheet formed of an insulating material, provided with an upper insulating sheet hole formed at a position corresponding to the electrically-conductive part, and coupled to an upper surface of the nonelastic electrically-conductive housing,
wherein a plurality of electrically-conductive particles are contained in an elastic insulating material and oriented in the thickness direction by magnetic field in the housing hole.

18. A method for manufacturing a test socket configured to electrically connect a tester generating a test signal and a device under inspection having a terminal, the method comprising:
(a) preparing a nonelastic electrically-conductive member formed of a nonelastic electrically-conductive material;
(b) forming a plurality of housing holes in the nonelastic electrically-conductive member to form a nonelastic electrically-conductive housing, the plurality of housing holes passing through a thickness direction the nonelastic electrically-conductive member;
(c) coating at least an upper surface of the nonelastic electrically-conductive housing and a circumference of each of the plurality housing holes with an insulating coating layer; and
(d) forming an electrically-conductive part, in which a plurality of electrically-conductive particles are contained in an elastic insulating material and oriented in the thickness direction by magnetic field, in the housing hole to be insulated from nonelastic electrically-conductive housing by the insulating coating layer.

19. The method of claim 18, wherein, in the step (c), the insulating coating layer is formed by a coating method selected from the group consisting of parylene coating, anodizing treatment, Teflon coating, and liquid silicone coating.

20. The method of claim 18, wherein, in the step (d), the electrically-conductive part is formed to satisfy the following condition:

$$0.05 \leq \frac{Lb}{Lt} \leq 0.5$$

here, Lt is a length obtained by adding a length of an electrically-conductive part body placed in the housing hole and a length of an electrically-conductive part lower bump connected to the electrically-conductive part body and protruding from a lower surface of the nonelastic electrically-conductive housing, and Lb is a length of the electrically-conductive part lower bump.

21. The method of claim 18, wherein, the step (d) comprises:
filling the plurality of housing holes with an electrically-conductive particle mixture in which a plurality of electrically-conductive particles are contained in an elastic insulating material;
preparing a mold having a plurality of mold holes corresponding to the plurality of housing holes, and filling the plurality of mold holes with the electrically-conductive particle mixture;
coupling the mold to a lower surface of the nonelastic electrically-conductive housing to correspond the plurality of mod holes to the plurality of housing holes in a one-to-one relation; and
integrally curing the electrically-conductive particle mixture received in the housing holes and the mold holes.

22. The method of claim 18, after the step (a), further comprising forming a ground terminal on a lower surface of the nonelastic electrically-conductive housing, the ground terminal being formed to have a configuration in which a plurality of electrically-conductive particles are contained in an elastic insulating material, and protruding from the lower surface of the nonelastic electrically-conductive housing and coming into contact with a ground electrode so as to enable the nonelastic electrically-conductive housing to be electrically connected to the ground electrode provided in the tester.

* * * * *